United States Patent [19]

Solomon

[11] Patent Number: 5,075,238
[45] Date of Patent: Dec. 24, 1991

[54] DETECTOR INTERFACE DEVICE

[75] Inventor: Allen L. Solomon, Fullerton, Calif.

[73] Assignee: Grumman Aerospace Corporation, Bethpage, N.Y.

[21] Appl. No.: 508,607

[22] Filed: Apr. 13, 1990

[51] Int. Cl.⁵ ............................................. H01L 21/86
[52] U.S. Cl. ........................................ 437/3; 156/607; 156/608; 437/84; 437/92; 437/185; 437/965
[58] Field of Search ................... 437/51, 3, 84, 89, 92, 437/183, 185, 965; 156/607, 608, 616.4, 616.41, 622

[56] References Cited

U.S. PATENT DOCUMENTS

| | | | |
|---|---|---|---|
| 4,618,763 | 10/1986 | Schmitz | 250/211 R |
| 4,633,086 | 12/1986 | Parrish | 250/338.1 |
| 4,659,931 | 4/1987 | Schmitz et al. | 250/338.4 |
| 4,692,610 | 9/1987 | Szuchy | 250/227.14 |
| 4,698,603 | 10/1987 | Clarius | 332/155 |
| 4,703,170 | 10/1987 | Schmitz | 250/211 R |
| 4,718,075 | 1/1988 | Horn | 378/91 |
| 4,734,577 | 3/1988 | Szuchy | 250/227.16 |
| 4,784,970 | 11/1988 | Solomon | 437/51 |
| 4,792,672 | 12/1988 | Schmitz | 250/211 R |
| 4,794,092 | 12/1988 | Solomon | 437/51 |
| 4,852,141 | 7/1989 | Horn | 378/147 |

Primary Examiner—Olik Chaudhuri
Assistant Examiner—S. Katz
Attorney, Agent, or Firm—Stetina and Brunda

[57] ABSTRACT

A method for constructing an infrared detector array directly upon a detector interface device is disclosed. The detector interface device mechanically and electrically connects the infrared detector array to signal processing equipment. In a first embodiment of the invention encapsulated single crystalline material is formed within a cavity formed in a substrate. The encapsulated single crystalline material formed within the substrate cavity is suitable for use as a seed crystal for graphotaxial crystal growth of a detector element support layer across the surface of the substrate. Detector elements can then be formed upon the detector element support layer. In a second embodiment of the invention a plurality of detector element support layers can be formed within an array of cavities formed upon the substrate. An individual infrared detector element can then be formed directly upon each of the detector element support layers to form a detector array upon the substrate. The use of a non-single crystalline substrate such as an alumina ceramic material provides sufficient structural integrity and thermal stability for the substrate to serve as a detector interface device to reliably connect the infrared detector elements to Z-plane modules.

8 Claims, 6 Drawing Sheets

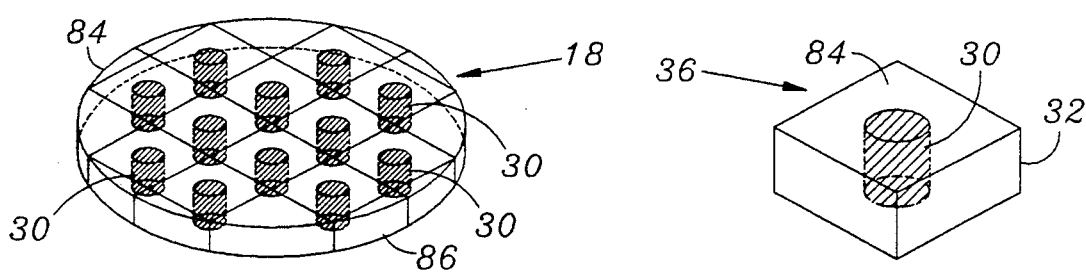
FIG. 6a  FIG. 6b
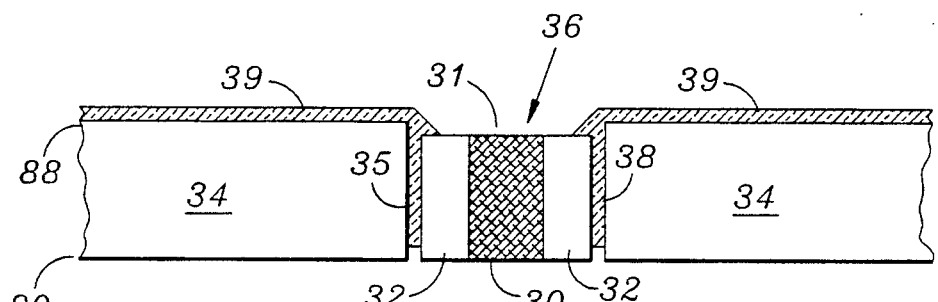
FIG. 7
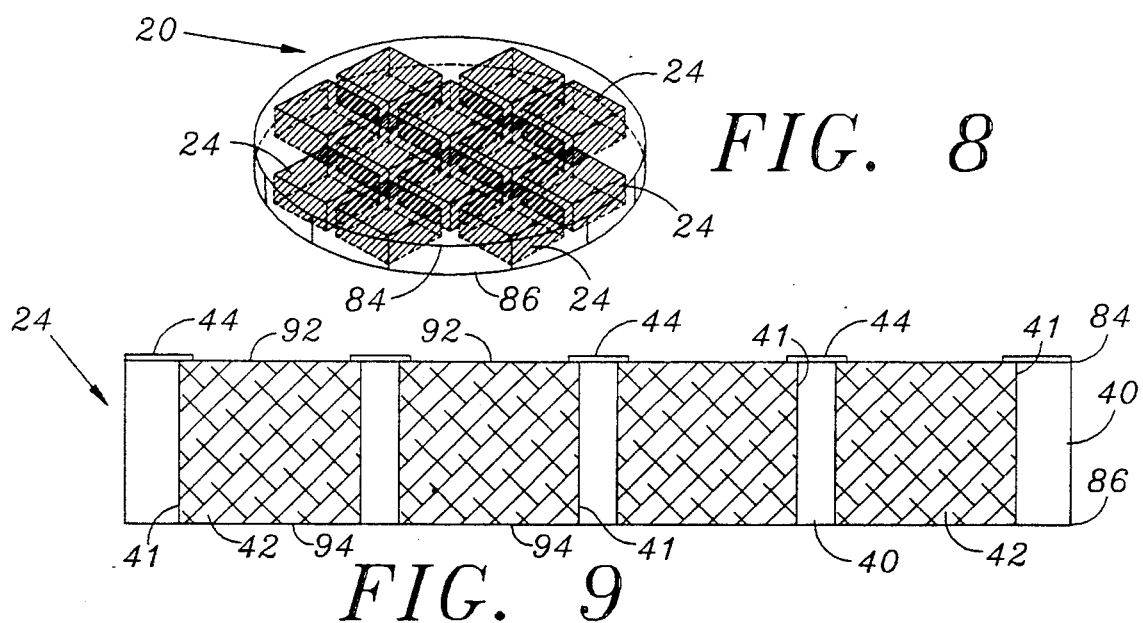
FIG. 8
FIG. 9
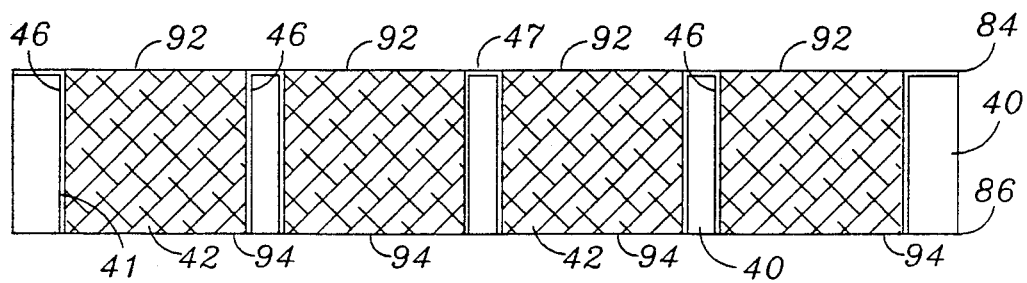
FIG. 10

DETECTOR INTERFACE DEVICE

FIELD OF THE INVENTION

The present invention relates generally to crystal growth techniques for infrared detector element fabrication and more particularly to a method for constructing an infrared detector array directly upon a detector-signal processor interface device. In a first embodiment of the invention encapsulated single crystalline material is formed within cavities formed in a substrate. The encapsulated single crystalline material formed within the substrate cavity is suitable for use as a seed crystal for graphotaxial crystal growth of a detector element film across the surface of a substrate. Detector elements can then be formed from this film material. In a second embodiment of the invention, individual infrared detector elements can be formed by epitaxial growth directly upon each of the cavity embedded single crystals to form a detector array upon the substrate. The use of a non-single crystalline substrate such as alumina ceramic material provides sufficient structural integrity and thermal stability for the substrate to serve as a detector interface device to reliably connect the infrared detector elements to Z-plane signal processor modules.

BACKGROUND OF THE INVENTION

The infrared spectrum covers a range of wavelengths longer than the visible wavelengths, but shorter than microwave wavelengths. Visible wavelengths are generally regarded as between 0.4 and 0.75 micrometers. The infrared wavelengths extend from 0.75 micrometers to 1 millimeter. The function of an infrared detector is to respond to the energy of a wavelength within some particular portion of the infrared region.

All materials generate radiant energy having characteristic wavelengths within the infrared spectrum depending on the temperature of the material. Many current infrared image detection systems incorporate arrays with large numbers of discrete, highly sensitive detector elements, the electrical outputs of which are connected to signal processing circuitry. By analyzing the pattern and sequence of detector element excitations, the processing circuitry can identify and track sources of infrared radiation.

Contemporary subarrays of detectors may be sized to include a signal array with 256 detector elements on a side, or a total of 65,536 detectors, the size of each square detector being approximately 0.009 centimeters on a side, with 0.00127 centimeters spacing between detectors. Such a subarray would therefore be 2.601 centimeters on a side. Interconnection of such a subarray to signal processing circuitry would require connecting each of the 65,636 detectors to processing circuitry within a square, a little more than one inch on a side. Each subarray may, in turn, be joined to other arrays to form an extended array that connects to 25,000,000 detectors or more. As would be expected, considerable difficulties are presented in electrically connecting the detector elements to associated circuitry.

Though the theoretical performance of such contemporary systems is satisfactory for many applications, it is difficult to construct structures that adequately interface large numbers of detector elements with associated signal processing circuitry in a practical and reliable manner. Consequently, practical applications for contemporary infrared image detector systems have necessitated further advances in the areas of miniaturization of the detector array and accompanying circuitry. Such miniaturization has necessitated improvement in the mechanical and electrical interfacing of detector element arrays to processing circuitry such as that found in Z-plane modules. Mechanical interfacing is additionally difficult when the detector material is brittle or consists of a fragile thin layer.

The Z-plane module is a layered structure containing integrated circuits which perform signal processing functions on the outputs of the detector element array. The Z-plane module extends along the Z axis, perpendicularly to the X-Y plane, i.e. the plane of the detector array. Thus, signal processing circuitry can be mounted on the focal plane, just behind the detector array, and can extend a sufficient distance in the Z direction to permit the mounting of the required components.

The outputs of detector elements typically undergo a series of processing steps in order to permit derivation of the informational content of the detector output signal. The more fundamental processing steps, such as preamplification, tuned band pass filtering, clutter and background rejection, multiplexing and noise suppression, are typically accomplished within the Z-plane module.

Less signal processing can be performed by circuitry on an x-y oriented wafer substrate than by a z-module. Such signal processing is usually limited to preamplification and multiplexing. In either case, the detector array is bump bonded to the processor. Because of the small size and the high density of these bonds, the detector array substrate must have sufficient mechanical integrity to withstand the bonding process and flexing when the detector array and the processor are operated at cryogenic temperatures.

Contemporary detector interface devices, particularly for detector arrays of HgCdTe epitaxially grown on CdTe, are typically ceramic or epoxy structures which provide for the mounting of detector arrays and provide for their mechanical and electrical connection to Z-plane modules. The detector arrays are installed on the detector interface device and the detector device on the module. Two operations are needed. Both require a high degree of alignment precision. It would be more desirable to provide a detector interface device which is an integrated structure with the detector element array. Forming the detector elements directly upon a high strength, thermally stable substrate would permit the substrate to function as a detector interface device which would be suitable for maintaining the electrical interconnection of the multitude of very small, closely spaced bonds. It would also eliminate the steps of having to electrically and mechanically interface the detector elements to the detector interface device. It would therefore eliminate a bonding operation and so result in a more reliable interconnection.

As such, although the prior art has long recognized the difficulty of obtaining structural integrity and thermal stability of the electrical and mechanical interconnection between infrared detector element arrays and their associated signal processing circuitry, the proposed solutions to date have been ineffective in providing satisfactory remedy.

SUMMARY OF THE INVENTION

The present invention specifically addresses and alleviates the above-mentioned deficiencies associated in the prior art. More particularly, the present invention comprises a method for constructing an infrared detector array directly upon a detector interface device. The detector interface device mechanically and electrically connects the infrared detector array to signal processing equipment.

In a first embodiment of the invention encapsulated single crystalline material is formed within a cavity formed in a substrate. The encapsulated single crystalline material formed within the substrate cavity is suitable for use as a seed crystal for graphotaxial growth of a detector element support layer across the surface of the substrate. Detector elements can then be formed upon the detector element support layer.

In a second embodiment of the invention a plurality of detector element support layers can be formed within an array of cavities formed upon the substrate. An individual infrared detector element can then be formed directly upon each of the detector element support layers to form a detector array upon the substrate.

The use of a non-single crystalline substrate such as an alumina ceramic material provides sufficient structural integrity and thermal stability for the substrate to serve as a detector interface device to reliably connect the infrared detector elements to Z plane modules or to other types of readouts or signal processors on a wafer x-y plane substrate.

Thus, two methods are provided for forming a detector interface device. In the first method one encapsulated seed crystal is disposed within substrate and used to graphotaxially form a single crystalline detector element support layer across the surface of the substrate. Detector elements are then formed upon the detector element support layer. The substrate is mechanically rigid and thermally stable, thus it is suitable for use as detector interface device. A method for forming the encapsulated seed crystal is disclosed.

In the second method individual detector elements are formed upon a mechanically rigid and thermally stable substrate by first forming single crystalline seed crystals within an array of cavities formed on the surface of the substrate. The single crystalline seed crystals serve as detector element support layers. The detector elements are then formed directly upon these detector element support layers.

The use of the single crystalline material formed in the array of the second embodiment of the present invention also facilitates the fabrication of superimposed detector elements wherein two separate spectral responses can be detected from a single array without increasing the surface area of the array. Detector elements are formed upon both the upper and lower surfaces of the detector element support layers such that incident infrared radiation may pass through one detector element and irradiate the detector element on the opposite side of the detector element support layer.

By forming detector elements directly upon a substrate having the required structural integrity and thermal stability, the prior art problems of connecting detector element arrays to their associated signal processing circuitry are eliminated.

The methods for forming the encapsulated seed crystal and for forming the single crystalline detector element support layers within an array of cavities upon a substrate are similar. Both methods comprise the steps of disposing a substrate within a sealable container, the substrate having at least one cavity formed therein; disposing a single crystalline material within the sealable container such that the cavities will be submerged within the single crystalline material when the single crystalline material is melted; reducing the pressure within the container to a pressure below atmospheric pressure sealing the container; heating the container to a temperature greater than the melting point of the single crystalline material and lower than the melting point of the substrate to melt the single crystalline material; and cooling the container to permit the crystallization of the single crystalline material.

In the first embodiment these steps are used to form the encapsulated seed crystal. In the second embodiment they form the plurality of seed crystals which serve as detector element support layers, each being formed within a cavity formed in the surface of a substrate.

The method for both forming a single crystalline material within cavities formed in a substrate to form seed crystals and also forming detector element support layers facilitates the fabrication of detector elements directly upon a detector interface device in two alternative manners. The detector interface device has the required mechanical rigidity and thermal stability to reliably connect thousands of very small connectors to corresponding connectors on a Z-plane module or other processor substrate. Formation of the detector elements directly upon the substrate eliminates the need to interface separate detector arrays to a detector interface device.

These, as well as other advantages will be more apparent from the following description and drawings. It is understood the changes in the specific structure shown and described may be made within the scope of the claims without departing from the spirit of the invention.

BRIEF DESCRIPTION OF THE DRAWINGS

FIG. 6a is a perspective view of a substrate having single crystalline seed crystals formed in the cavities thereof;

FIG. 6b is an enlarged perspective view of one single crystalline material filled cavity of the substrate of FIG. 6a, having been cut or separated from the rest and defining an encapsulated seed crystal;

FIG. 7 is a cross-sectional side view of the encapsulated seed crystal of FIG. 6b disposed within a cavity formed within a substrate;

FIG. 8 is a perspective view of the substrate of FIG. 3 having rectangular arrays of single crystalline material formed therein;

FIG. 9 is a cross-sectional side view of four cavities from one array of FIG. 8, the cavities having single crystalline detector element support layers formed therein and also having a conductive grid formed upon the planar upper surface of the array;

FIG. 10 is a cross-sectional side view of four cavities from one array of FIG. 8, the cavities having single crystalline detector element support layers formed therein, a conductive grid being formed intermediate the substrate and the detector element support layers formed within the cavities of the substrate, the conductive grid also being formed upon the planar upper surface of the substrate;

DETAILED DESCRIPTION OF THE PREFERRED EMBODIMENT

Figure 1:
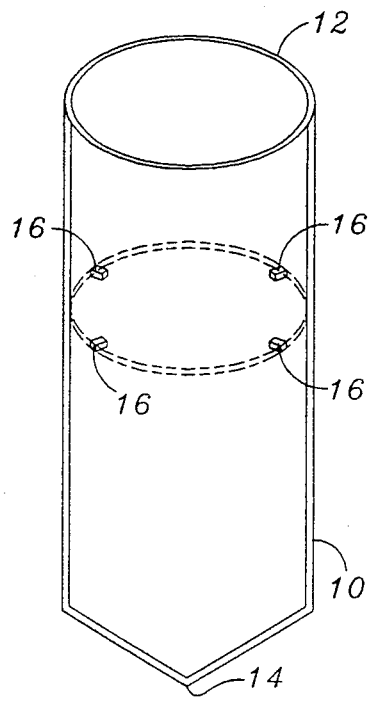
FIG. 1 is a perspective view of a sealable container used in the fabrication of encapsulated seed crystals and arrays according to the present invention.

The detailed description set forth below in connection with the appended drawings is intended as a description of the presently preferred embodiment of the invention, and is not intended to represent the only form in which the present invention may be constructed or utilized. The description sets forth the functions and sequence of steps for constructing and operating the invention in connection with the illustrated embodiments. It is understood, however, that the same or equivalent functions and sequences may be accomplished by different embodiments that are also intended to be encompassed within the spirit and scope of the invention.

The method for forming an infrared detector array directly upon a detector interface device according to the present invention is illustrated in FIGS. 1-24 of the drawings which depict two presently preferred embodiments of the invention. As those skilled in the art will recognize, the method of the present invention utilizes the Stockbarger method of growing single crystalline material to form the encapsulated seed crystals of the first embodiment and the detector element support layers of the second embodiment. Those skilled in the art will recognize that deviations can be made from the Stockbarger method to practice the present invention. The Stockbarger method has previously only been used to form boules or a single mass of single crystalline material. The present invention is the only known usage of the Stockbarger method or the like to form a plurality of single crystalline seed crystals or detector support layers within cavities formed upon a substrate.

The detector interface device of the present invention is mechanically rigid and thermally stable. Those skilled in the art will recognize that the method of the present invention may be utilized to form single crystalline material within a variety of different types of substrates, e.g., single crystalline, non-crystalline, and polycrystalline, and may be used for a variety of different purposes.

The methods of forming the infrared detector arrays upon detector interface devices in both the first and second preferred embodiments require the formation of single crystalline material within cavities formed in a non-single crystalline substrate. In the first embodiment this is the formation of encapsulated seed crystals and in the second embodiment it is the formation of a detector element support layer The method for forming a single crystalline material such as CdTe within cavities formed in a non-single crystalline substrate such as alumina ceramic comprises the steps of disposing the substrate within a sealable container, the substrate having at least one cavity formed therein; disposing the single crystalline material within the sealable container such that the cavities will be submerged within the single crystalline material when the single crystalline material is melted; reducing the pressure within the container to a pressure below atmospheric pressure to evacuate air;

sealing the container; heating the container to a temperature greater than the melting point of the single crystalline material and lower than the melting point of the substrate to melt the single crystalline material; and cooling the container through a temperature gradient to permit the crystallization of the single crystalline material.

Although the preferred embodiment of the present invention utilizes CdTe as the single crystalline material and alumina ceramic as the substrate, those skilled in the art will recognize that other materials are also suitable.

Referring now to FIG. 1, a container 10 has a pointed bottom 14 and open top 12. Supports 16 are placed in a common horizontal plane inside the container 10.

Figure 2:
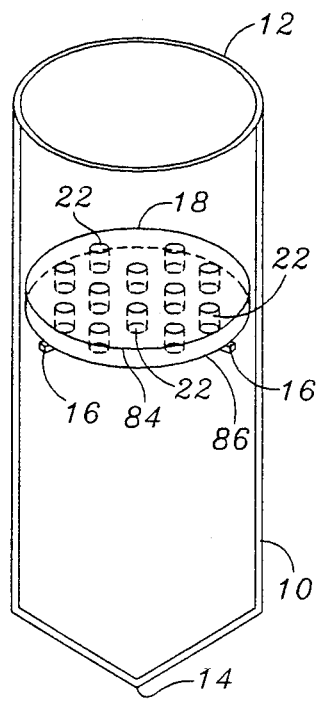
FIG. 2 is a perspective view of the container of FIG. 1 having a substrate for the formation of encapsulated seed crystals disposed therein.

Referring now to FIG. 2, an alumina ceramic substrate or seed crystal plate 18 is disposed within container 12 such that the lower surface 86 of the seed crystal plate 18 rests upon supports 16 The seed crystal plate 18 has seed crystal cavities 22 formed therein. Seed crystal cavities 22 are typically cylindrically shaped apertures or through-holes which pass from the first or upper surface 84 of the seed crystal plate 18 to the second or lower surface 86 of the seed crystal plate 18. The seed crystal plate 18 is used to form individual seed crystals which may subsequently be cut from the seed crystal plate 18 to form individual ceramic encapsulated seed crystals (36 of FIG. 6b).

Figure 3:
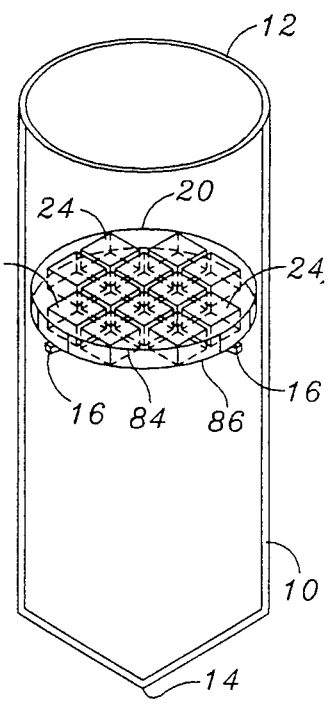
FIG. 3 is a perspective view of the container of FIG. 1 having a substrate for the formation of arrays disposed therein.

Referring now to FIG. 3, an array plate 20 may alternatively be disposed within container 12 such that its lower surface 86 rests upon supports 16. The array plate 20 has a plurality of rectangular shaped cavities 24 formed therein. The cavities 24 are typically through-holes, passing from the first or upper surface 84 of the array plate 22 to the second or lower surface 86 of the array plate 20. The array plate 20 is used to form a plurality of arrays of single crystalline material. The single crystalline material formed in each cavity functions as a detector element support layer upon which a detector element may be formed. Individual arrays may subsequently be cut from the array plate to be used in the fabrication of infrared photo-detector element arrays having integral detector interface devices.

In the process of the preferred embodiments of the present invention the container 12 is filled with the material to be melted to a point just below supports 16. Either a seed crystal plate 18 or an array plate 20 is then disposed within container 12 upon supports 16. A sleeve spacer 26 is placed upon the seed crystal plate 18 or array plate 20 to prevent it from floating upon the denser single crystalline material after the material is melted.

Figure 4:
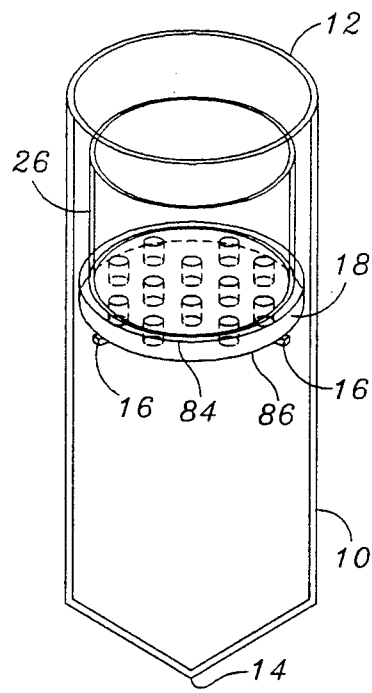
FIG. 4 is a perspective view of the container of FIG. 2 having a hollow cylindrical spacer disposed above the substrate to prevent the substrate from floating upon the melted single crystalline material.
Figure 5:
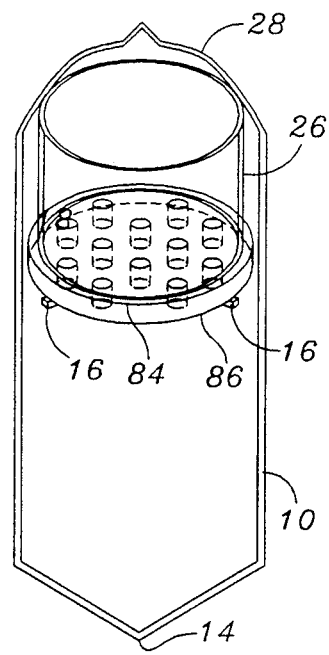
FIG. 5 is a perspective view of the container of FIG. 4 wherein the opening in the top of the container has been sealed.

FIGS. 4 and 5 illustrate the process of forming encapsulated seed crystals within a seed crystal plate 18 according to the first embodiment of the present invention. The formation of detector element support surfaces within an array plate 20 occurs in a like manner.

FIG. 4 illustrates a sleeve spacer 26 disposed upon a seed crystal plate 18. After placing the sleeve spacer 26 upon the seed crystal plate 18, additional material to be melted is then added to container 12 to insure that the melted single crystalline material will cover the seed crystal plate 18 or array plate 20 upon melting. The container 12 is then connected to a vacuum system and heated to remove virtually all the air. It is then sealed under vacuum such that the top of the sleeve touches the taper of the seal 28 as depicted in FIG. 5. This assures that the seed crystal plate 18 or array plate 20 is held firmly in place upon supports 16. The single crystalline material disposed within the container melts to form a liquid which flows into the cavities 22 within the seed crystal plate 18 or the arrays of cavities 24 within the array plate 20.

After sealing, the container 10 is placed in the melt or high temperature zone in an upper portion of a vertical furnace. After the single crystalline material is thoroughly melted, the container 10 is gradually lowered through an intermediate temperature zone within the vertical furnace. The vertical furnace contains a temperature gradient such that the temperature at the top of the vertical furnace is above the melting point of the single crystalline material, but below the melting point of the substrate, and the temperature gradually decreases toward the bottom of the vertical furnace. An intermediate temperature zone is formed below the high temperature zone, wherein the temperature of the intermediate temperature zone is less than the melting temperature of the single crystalline material. A lower temperature zone is formed below the intermediate temperature zone.

The single crystalline material begins to solidify as it passes through the intermediate temperature zone. The low temperature zone can be used to anneal and then to cool the single crystalline material before it is removed from the furnace The pointed bottom 14 of the container 10 provides a single point for the initialization of the crystallization process to provide a seed crystal for the melt. Crystallization commences at the point 14 and continues upward throughout the container, thus forming a single crystal.

After the container 10 is removed from the vertical furnace, it is out open and the solidified material is removed. The plate 18 or 20 is cut away from the excess solidified single crystalline material such that only the single crystalline material formed within the cavities remains in contact with the substrate. The plate 18 or 20 is lapped and polished as is common in the art, to form smooth flat upper and/or lower surfaces.

Referring now to FIG. 6a, a cut and polished seed crystal plate 18 of the first embodiment of the present invention is shown. The seed crystal plate 18 contains a plurality of cavities, each of which have, for example, a CdTe seed crystal 30 formed therein. Individual seed crystals 30 may be cut from the seed crystal plate 18 such that they form individual ceramic encapsulated single crystalline seed crystals 36 as depicted in FIG. 6b. The ceramic 32 material which encapsulates the seed crystal 30 protects the seed crystal 30 during handling. The CdTe of which the seed crystal 30 is comprised is brittle and it is very difficult to handle such delicate small pieces of CdTe without damaging them.

As shown in FIG. 7, the ceramic encapsulated seed crystal 36 of FIG. 6b is sealed in a cavity of an insulator plate 34 with material 38. Plate 34 can then be used as a substrate for forming a single crystalline layer (not shown) upon it by graphotaxial growth (discussed below). This single crystalline layer would then function as a detector element layer wherein infrared photo detector elements may then be formed.

The substrate 34 is comprised of alumina ceramic material because of its structural rigidity and thermal stability. A glass layer 38 secures the seed crystal 36 to the substrate 34. The glass layer 39 extends across the upper surface 88 of the substrate 34 and forms a smooth surface upon which graphotaxial growth of a single crystalline detector element support layer can take place.

The glass layers 38 and 39 are formed by disposing powdered glass within the void between the seed crystal 36 and the substrate 34 and also upon the substrate 34, then heating the substrate 34 to a temperature sufficiently high to fuse with the substrate 34 and seed crystal 36, but not high enough to melt the substrate 34.

Graphotaxy, or lateral epitaxy, is the growth of a single crystalline layer across the surface of a non-single crystalline substrate, such as glass or alumina ceramic material, by commencing growth at a single-crystalline seed surface. In the present invention, this single crystalline seed surface is provided by the upper surface 31 of seed crystal 30. Growth takes place layer-by-layer upon the seed crystal 30 as it progresses through cavity 35 formed in substrate 34. When it reaches the non-single crystalline glass layer 39, the single-crystalline growth spreads laterally across glass layer 39. The seed crystal 30 establishes the crystalline structure and orientation of the graphotaxially grown layer. Once established, the structure and orientation are maintained since all growth originates from the same single-crystalline seed surface.

The graphotaxy process is contrasted to conventional epitaxial growth where a crystal layer is limited to the surface of a single crystalline substrate. In graphotaxy, only a small single crystalline area is required to establish the structure and orientation of the layer to be grown.

The layer of single crystalline material is grown across the glass layer 39 to form a single crystalline substrate or detector support layer upon which detector elements may be formed by processing techniques that are well known in the art.

As shown in FIG. 8, an array plate 20 of the second embodiment of the present invention has been cut and polished. Excess single crystalline material must be removed from the array plate 20 after it has cooled and been removed from the sealable container 12 as was done with the seed crystal plate 18 of the first embodiment. The excess material is typically cut away and the array plate 20 is then polished to provide a smooth surface suitable for detector element fabrication. A plurality of arrays 24 are formed within the array plate 20. Each array 24 comprises a plurality of individual cavities, each cavity containing single crystalline material which is suitable for use as a detector support surface. The individual arrays 24 may be out from the plate to be used in the fabrication of infrared detector element arrays formed upon detector interface devices.

Referring now to FIG. 9, an enlarged cross sectional view of a portion of a single array 24 of FIG. 8 is shown. The single crystalline material 42 is disposed within cavities 41 formed in the alumina ceramic substrate 40 such that the upper 92 and lower 94 planar surfaces of the single crystalline material are co-planar with the upper 84 and lower 86 surfaces of the substrate 40. The single crystalline material 42 forms the detector element support surface upon which individual infrared detector elements may be formed.

A conductive grid 44 is formed upon the upper surface of the array 24. The conductive grid 44 serves to electrically interconnect the photosensitive material of a first type or common counter electrodes 54 (shown in FIGS. 14 and 15) from each of the detector elements which are to be formed upon the upper surface 84 of the substrate 40. The conductive grid 44 will also electrically connect each of the detector elements to a counterelectrode 58. As will be seen below, the counterelectrode 58 occupies a position normally occupied by a detector element and provides a contact point where a conductive bump 50 can electrically connect the common electrodes 54 to a processor circuit module.

FIG. 10 illustrates a second means of electrically interconnecting a common electrode 54 from each of the detector elements. This is accomplished by coating the walls of each cavity 41 with a metal film 46 prior to forming the single crystalline material 42 therein. The upper surface 84, and alternatively the lower surface 86 also, is coated With the metal film 47 to provide continuous electrical interconnection between cavities 41. The use of a metal film 46 within the cavities 41 also enhances the adhesion of CdTe single crystalline material 42 to an alumina ceramic substrate 40.

Figure 11:
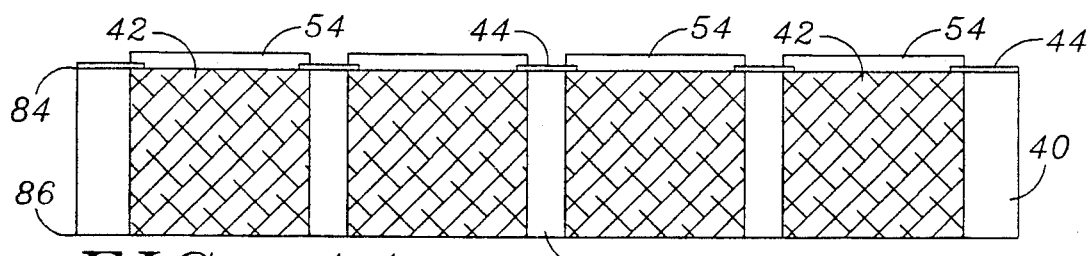
FIG. 11 is a cross-sectional side view of the array as depicted in FIG. 9 additionally having detector element material of a first type formed upon the planar upper surface of the detector element support layer.
Figure 12:
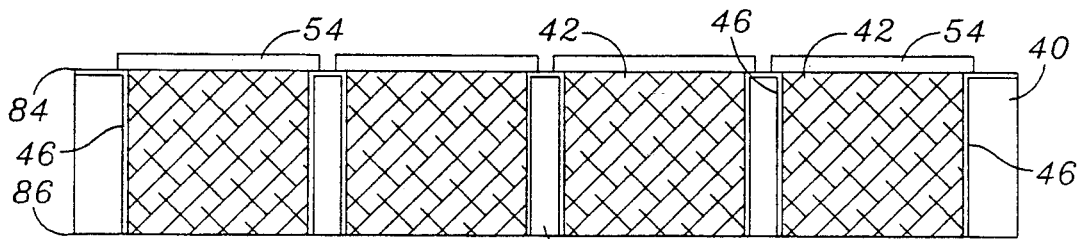
FIG. 12 is a cross-sectional side view of the array as depicted in FIG. 10 additionally having detector element material of a first type formed upon the planar upper surface of the detector element support layer.

Referring now to FIGS. 11 and 12, a photosensitive material of a first type 54 is formed upon the first or upper surface 84 of the single crystalline material 42 which forms the detector element support surfaces of FIGS. 9 and 10. In the preferred embodiment of the present invention the photosensitive material of a first type is p-type HgCdTe. The photosensitive detector elements of a first type in FIG. 11 are electrically interconnected by conductive grid 44. The photosensitive detector elements of a first type in FIG. 12 are electrically interconnected by conductor grid 46.

Figure 13:
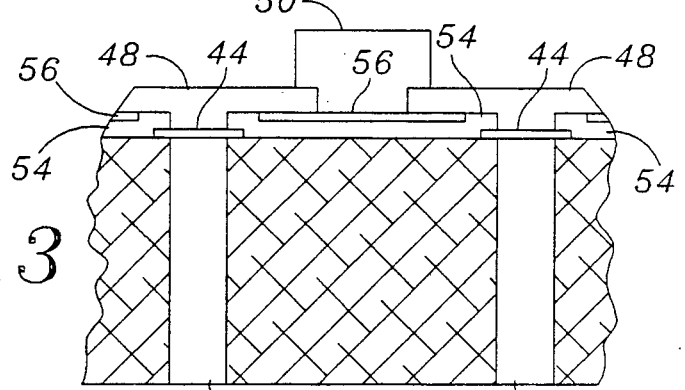
FIG. 13 is an enlarged cross-sectional side view of the array of FIG. 11 having detector element material of a second type formed within the detector element material of the first type and also having a conductive bump for bonding formed upon the detector material of a second type, an insulator layer has been formed upon the conductive grid and partially covers the detector element materials of a first and second type.
Figure 14:
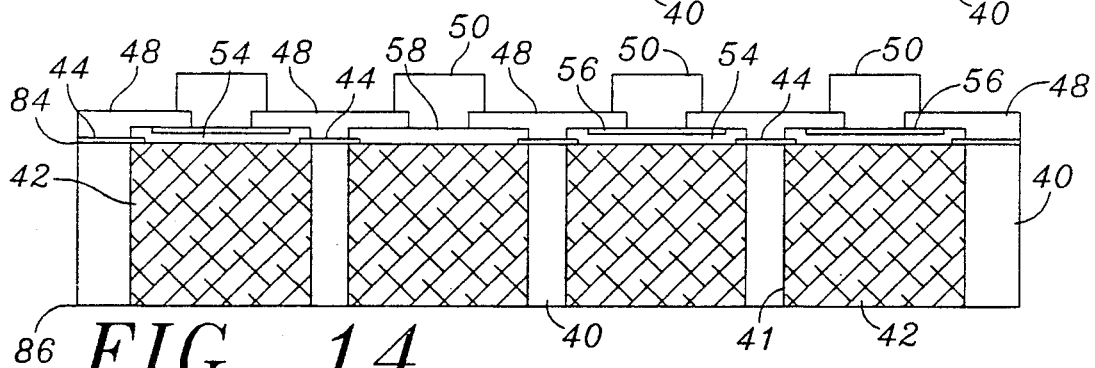
FIG. 14 is a sectional side view of the detector element array of FIG. 13, additionally showing a counterelectrode formed above the second cavity from the left.

Using methods well known in the art, a portion of the photosensitive detector element material of a first type 54 is converted into photosensitive detector element material of a second type 56 as shown in FIGS. 13 and 14 to form photosensitive detectors. In the preferred embodiment of the present invention the photosensitive material of a second type is n-type HgCdTe. Those skilled in the art will recognize that other photosensitive materials are suitable and that the p-type and n-type materials are interchangeable as long as both types are used in each detector.

Alternatively, the photosensitive detector element material of a second type 56 may be epitaxially grown upon the photosensitive detector element material of a first type 54 to form photosensitive detector elements.

One of the photosensitive detector elements of a first type 54 is not formed into a completed photosensitive detector. It is to be used as a counterelectrode contact 58. The counterelectrode contact 58 provides a means for electrically connecting the conductive grid 44 to a conductive bump 50. This allows electrical connection of the conductive grid 44 and the common electrode or photosensitive detector element material of a first type 54 to external circuitry. Conductive contacts or bumps 50 are formed upon the photosensitive detector element material of a second type 56 to provide electrical contact from each detector element to external circuitry.

An insulator 48 is formed upon the photosensitive detector element of the first 54 and second 56 types and the conductive grid 44 or 46. A portion of each photosensitive detector element of the second type 56 is not covered by the insulator 48. This exposed portion provides a contact area where conductive bumps 50 are formed upon the photosensitive detector elements of the second type 56. These conductive bumps 50 function as electrical contacts from each of the photosensitive detector elements of the second type 56 to external circuitry. Electrical contact from the common photosensitive detector elements of the first type 54 to external circuitry is provided by a bump 50 formed upon the counterelectrode 58.

Figure 15:
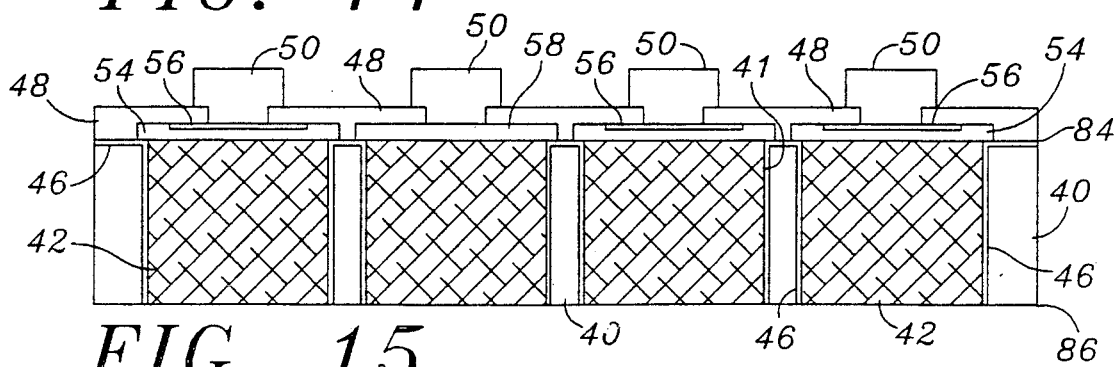
FIG. 15 is a detector element array as shown in FIG. 12 further having detector element material of a second type formed within the detector element material of the first type and also having an insulator formed over the conductive grid and the detector element materials of the first and second types and further having conductive bumps formed over the detector element material of the second type, a counterelectrode being formed above the second cavity from the left.

FIG. 14 shows the detector element material of a second type 56, insulator 48, and conductive bump 50 formed upon the array having a conductive grid 44 formed upon its first surface 84 as shown in FIG. 11. FIG. 15 shows the detector element material of a second type 56, insulator 48, and conductive bump 50 formed upon the array having a conductive grid 46 formed within each cavity 41 as shown in FIG. 12.

The detector arrays of FIGS. 14 and 15 require illumination from the second or lower surface 86. This means that infrared radiation which is to be detected must be incident upon the lower surface 86 of the array and must be transmitted through the array to reach the detector elements. The array cannot be illuminated from the first or upper surface 84 because this surface has the conductive bumps 50 formed thereon and is also attached to a processor circuit module.

Figure 16:
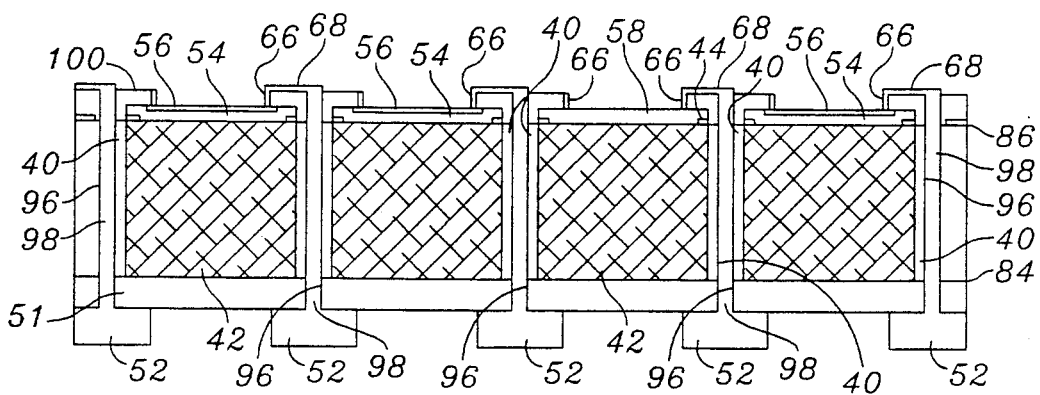
FIG. 16 is a detector element array as shown in FIG. 11 additionally having vias formed therethrough and conductive bumps formed upon the lower surface thereof.
Figure 17:
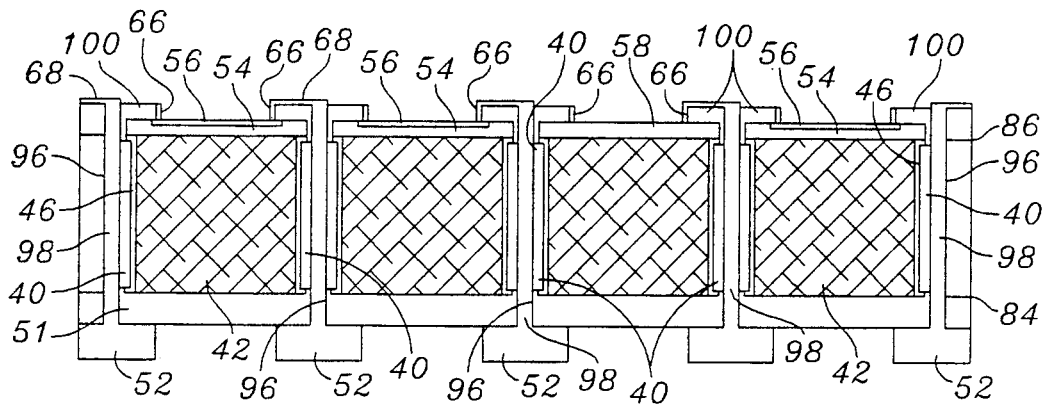
FIG. 17 is a detector element array as shown in FIG. 12 additionally having vias formed therethrough and conductive bumps formed upon the lower surface thereof.

The detector element array can alternatively be formed upon the second surface 86 as shown in FIGS. 16 and 17. This permits the direct illumination of the detector elements by infrared radiation incident upon the second surface 86 of the array. Note that the array is always illuminated upon surface 86 and conductive bumps are always formed upon surface 84. Electrical connection of the array to a Z-plane module is accomplished through the conductive bumps 52 formed on the first surface 84 of the array. Fabrication of an array having detector elements on one surface and conductive bumps 52 on the opposite surface is accomplished by forming vias 96 through the alumina ceramic substrate and forming conductive conduits 98 within the via 96. The conductive conduits 98 are metal conductors deposited within or on the walls of the via holes 96. Such metal deposition can be performed by techniques well known in the art. Insulating layer 51 insulates the conductive bumps 52 from the single crystalline material 42.

Figure 18:
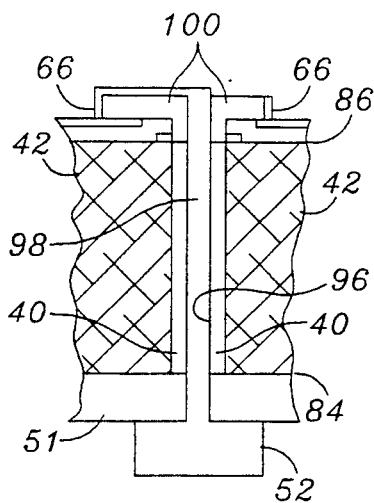
FIG. 18 is an enlarged cross-sectional side view of a single via of FIG. 16 showing an electrical conductive conduit formed therein.

FIG. 18 is an enlarged perspective view of a single via 96 and the conductive conduit 98 formed therein. The vias 96 may be formed by any conventional method such as etching or laser drilling.

Figure 19:
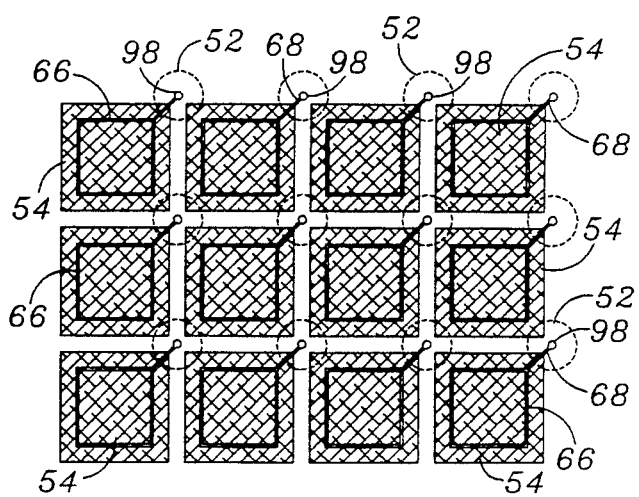
FIG. 19 is a top view of the array of detector elements showing the electrodes, the conductive conduits leading from the electrodes to the vias and the positioning of the conductive bumps on the opposite side of the array.

FIG. 19 depicts a top view of a portion of an array having detector elements, shown as photosensitive material of a first type 54, formed upon the second surface 86 and conductive bumps 52 formed upon the first surface 84 as illustrated in FIGS. 16 and 17.

The only difference between the two arrays depicted in FIGS. 16 and 17 is the structure of the conductive grids 44 and 46. The conductive grids 44 and 46 are not shown in FIG. 19, therefore FIG. 19 can be used to show the relative positions of the photosensitive material of a first type 54, the electrode 66, the horizontal portion 68 of the conductive conduit 98, the conductive conduit 98, and the conductive bump 52 of FIGS. 16 and 17. All of these items except the conductive bump 52 are on second surface 86 of the array. The conductive bump 52 is disposed upon the first surface 84 of the array. The conductive conduit 98 extends from the second surface 86 to the first surface 84 of the array as shown in FIGS. 16 and 17.

Figure 20:
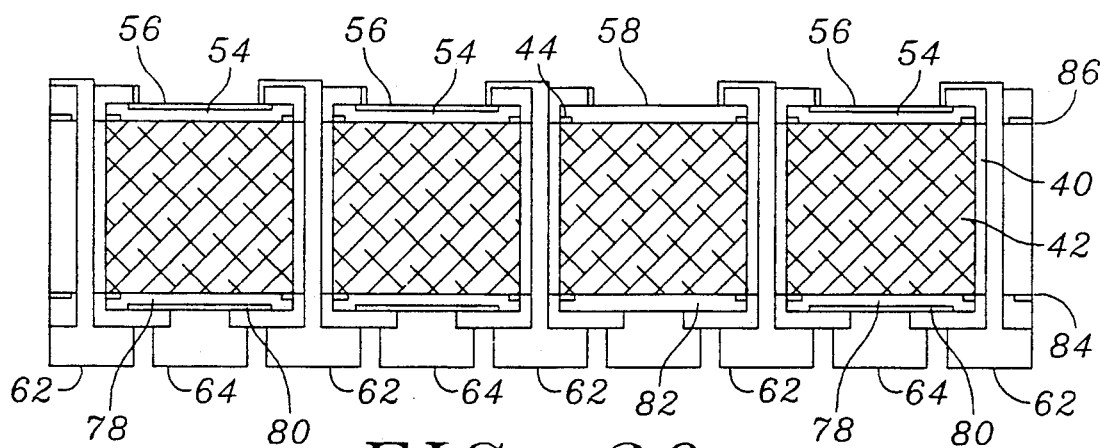
FIG. 20 is a sectional side view of an array having detector elements formed on both its upper and lower surfaces and having a conductive grid formed upon both the upper and lower planar surfaces of the array.
Figure 21:
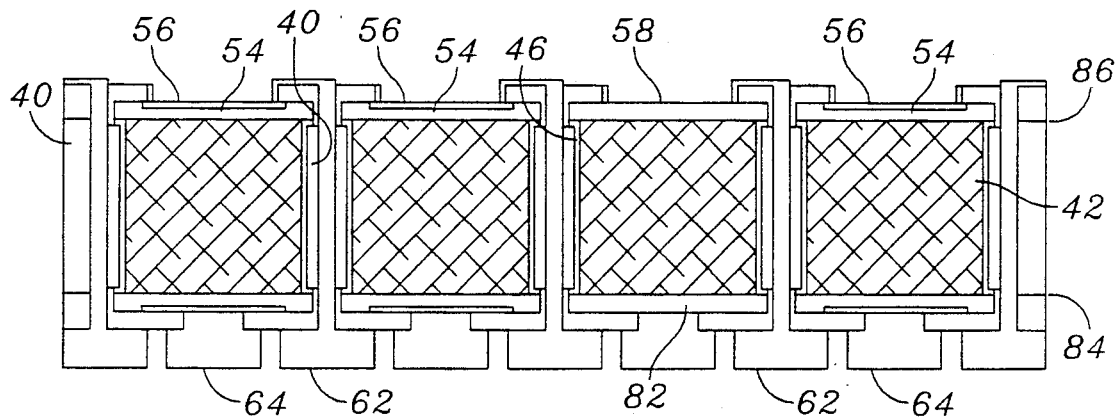
FIG. 21 is a sectional side view of an array having detector elements formed upon both its upper and lower surfaces and having a conductive grid formed intermediate the substrate and the single crystalline material formed within each cavity.

As shown in FIGS. 20 and 21, detector elements may be formed on both the second surface 86 and first surface 84 of the array. The use of two detector elements makes it possible to detect infrared radiation within two different ranges of wavelengths at the same detector element location within the array. This is possible since the spectral sensitivity of each detector element is dependent upon its particular composition. For example, the ratio of Hg to Cd Within the detector elements of HgCdTe photosensitive detectors determines which wavelength bands of infrared radiation are absorbed and therefore sensed and which are transparent. Therefore it is possible to form infrared detector elements upon the second surface 86 which are sensitive to shorter wavelengths and which transmit longer Wavelengths through the single crystalline material 42 to the second detector elements formed upon the first surface 84 of the array.

FIG. 20 depicts an array having the conductive grid 44 formed upon its first surface 84 as in FIG. 9. FIG. 21 depicts an array having the conductive grid 46 formed intermediate the substrate 40 and the singe-crystalline 42 material formed therein as shown in FIG. 10.

Figure 22:
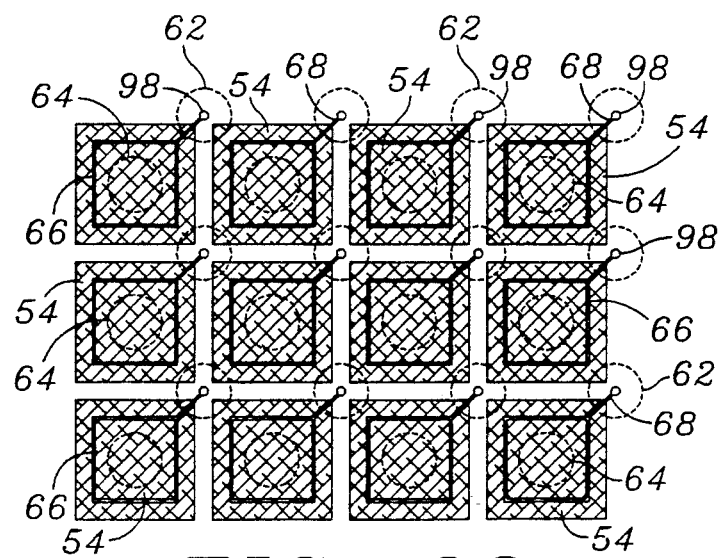
FIG. 22 is a top view of an array having infrared detector elements formed upon both its upper and lower surfaces, showing the location of conductive bumps for the detector elements upon both the upper and lower surfaces.
Figure 23:
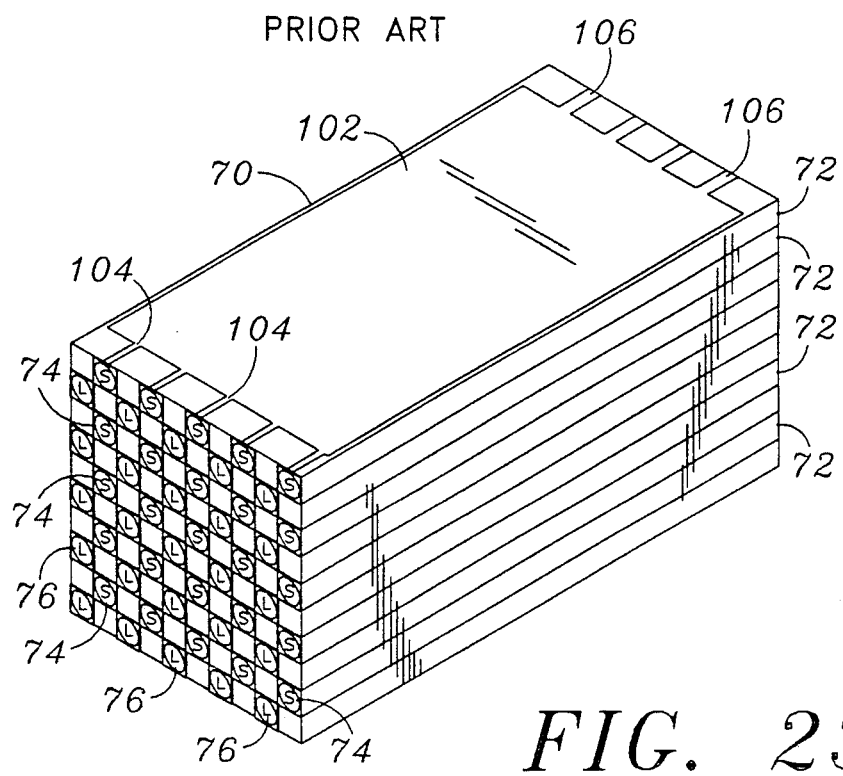
FIG. 23 is a perspective view of a Z-plane module showing the bumps which form electrical contacts to the detector element array having separate processor layers for the upper and lower detector arrays.
Figure 24:
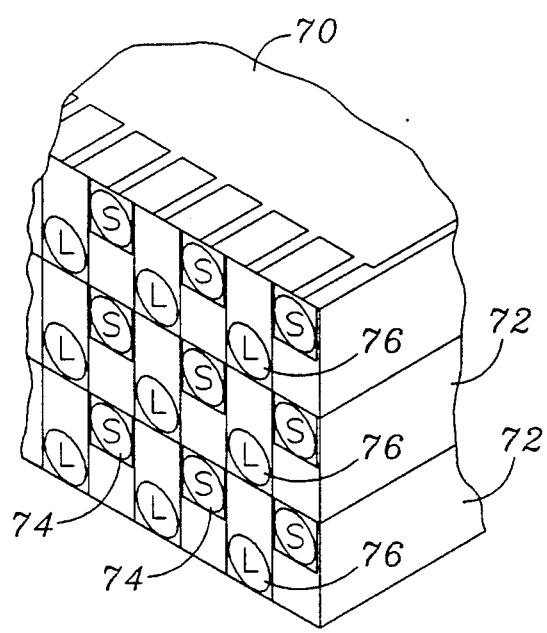
FIG. 24 is an enlarged perspective view of a Z-plane module having both the upper and lower detector array bumps formed upon each layer of the module.

FIG. 22 is a top view of a portion of the infrared detector element arrays depicted in FIGS. 20 and 21 showing the relative positions of the conductive bumps 62 and 64 which provide electrical contact from the detector elements formed upon the first 84 and second 86 surfaces of the array to the processor circuit module. All of the conductive bumps 62 and 64 are disposed upon the first surface 84 of the array. FIGS. 23 and 24 also show the relative positions of the conductive bumps 62 and 64 of FIGS. 20 and 21. The conductive conduit 98 extends from the second surface 86 to the first surface 84 of the array as discussed in reference to FIG. 19.

FIG. 23 is a perspective view of a prior art Z-plane module 70 to be used with a detector array having photosensitive detector elements formed upon both surfaces. The detector array is typically bump bonded to the Z-plane processor circuit module 70. The first surface 84 of the array having the conductive bumps 62 and 64 is placed in laminar juxtaposition with the surface of the Z-plane module 70 having corresponding conductive bumps 74 and 76. The conductive bumps 62 and 64 of the array contact the conductive bumps 74 and 76 of the Z-plane module 70 and provide electrical contact therebetween.

The conductive bumps 74 on the Z-plane module are labeled with an "S" and provide electrical contact to the detector elements for detecting shorter wavelength infrared radiation formed upon the second surface 86 of the array. The conductive bumps 76 are labeled with an "L" and provide electrical contact to the detector elements for detecting longer wavelength infrared radiation formed upon the first surface 84 of the array. One of the conductive bumps 74 or 76 may serve as a contact for the counterelectrode 58.

The Z-plane module 70 is comprised of layers 72 disposed in a vertical stack. Each layer 72 has a plurality of integrated signal processing circuits with one processor channel for each detector element. Channels 104 provide openings through which electrical leads may connect conductive bumps 74 and 76 to the signal processing circuitry. Channels 106 provide processor circuit operating leads to the module. Modules are stacked vertically and butted horizontally.

Each layer 72 of the Z-plane module 70 is alternately connected to either the shorter wavelength infrared radiation detector elements or the longer wavelength infrared detector elements. Each layer 72 therefore contains signal processing circuitry for processing either the longer or the shorter wavelength infrared radiation.

In FIG. 24 the long and short wavelength contact bumps are incorporated into single layers 72, thus halving the number of layers required and doubling the amount of circuitry within each layer. The layers 72 of FIG. 24 each contain signal processing circuitry for processing both the longer and the shorter wavelength infrared radiation.

It is understood that the exemplary method of forming encapsulated seed crystals as described herein and shown in the drawings represents only a presently preferred embodiment of the invention. Indeed, various modifications and additions may be made to such embodiment without departing from the spirit and scope of the invention. For example, neither the size nor shape of the substrate nor that of the cavities formed therein need to be limited to that as disclosed. The method of the present invention could be used, for example, to form single crystalline material of a square cross section within a spherically shaped substrate. Also, the method of the present invention need not be limited to use in the fabrication of infrared photodetector element arrays. The method of the present invention could be used in various integrated circuit fabrication techniques Thus, these and other modifications and additions may be obvious to those skilled in the art and may be implemented to adapt the present invention for use in a variety of different applications.

What is claimed is:

1. A method for forming an array of detector elements directly upon a detector interface device the method comprising the steps of:
    (a) disposing an encapsulated seed crystal within a cavity formed within a surface of a substrate;
    (b) forming a glass layer upon the surface of the substrate, the glass layer having an aperture formed therein, the aperture being disposed above the seed crystal;
    (c) graphotaxially growing a single crystalline layer from the seed crystal across the glass layer to form a detector element support layer upon which infrared detector elements may be formed;
    (d) forming an array of detector elements upon the detector element support layer;
    (e) forming a plurality of conductive bumps upon a surface of the substrate, the plurality of conductive bumps suitable for electrically interfacing the detector elements to external circuitry.

2. The method as recited in claim 1 wherein the step of forming a glass layer upon the surface of the substrate comprises forming a glass layer upon the surface of an alumina ceramic material.

3. The method as recited in claim 2 wherein the step of disposing an encapsulated seed crystal within a substrate comprises disposing a ceramic encapsulated CdTe seed crystal within the substrate.

4. A method for forming an array of infrared detector elements directly upon a detector interface device, the method comprising the steps of:
    (a) disposing a substrate having at least one cavity formed therein within a sealable container;
    (b) filling the container with a single crystalline material of a first type such that the single crystalline material will flow into the cavities formed within the substrate When the single crystalline material of a first type is melted;
    (c) reducing the pressure within the container to a pressure less than atmospheric pressure;
    (d) sealing the container;
    (e) heating the container to a temperature greater than the melting point of the single crystalline material and lower than the melting point of the substrate to melt the single crystalline material;
    (f) cooling the container through a temperature gradient to permit the crystallization of the single crystalline material;
    (g) cutting the any excess single crystalline material from the substrate such that substantially only the single crystalline material formed within the cavities remains in contact with the substrate;
    (h) polishing the surface of the substrate upon which the cavities are disposed;
    (i) forming conductive conduits upon the surface of the substrate to define a common detector element electrode grid;
    (j) forming first layers of photosensitive material of a first type over the single crystalline material which crystallized within the cavities; and
    (k) forming second layers of photosensitive material of a second type substantially over the first layers of photosensitive material of a first type to form an array of individual photosensitive detector elements.

5. The method as recited in claim 4 wherein the steps of disposing a substrate within a sealable container, filling the container with a single crystalline material, reducing the pressure with the container, sealing the container, heating the container, and cooling the container are performed according to the Stockbarger method.

6. The method as recited in claim 5 further comprising the steps of:
    (a) forming an insulator over said conductive conduits; and
    (b) forming a conductive bump onto each of said layers of photosensitive material of a second type, the conductive bumps suitable for electrically interfacing said detector elements to external circuitry.

7. The method as recited in claim 6 wherein the step of forming conductive conduits comprises forming a metal film substantially over the surface of the substrate prior to the step of forming a first layer of photosensitive material of a first type over the single crystalline material, the metal film having apertures formed above the single crystalline material formed within the cavities.

8. The method as recited in claim 6 wherein the step of forming conductive conduits comprises forming a metal film within a plurality of cavities of the substrate prior to the step of disposing the substrate within a sealable container to improve the adhesion of said single crystalline seed crystals to the substrate, the metal film also extending across the planar surface of the substrate to function as a common electrode grid for the detector elements.

* * * * *